United States Patent
Yeh et al.

(10) Patent No.: US 7,307,380 B2
(45) Date of Patent: Dec. 11, 2007

(54) CATHODE STRUCTURE FOR INVERTED ORGANIC LIGHT EMITTING DEVICES

(75) Inventors: Yung Hui Yeh, Hsinchu (TW); Chung Chih Wu, Taipei (TW); Chieh Wei Chen, Fengyuan (TW); Chun Liang Lin, Zhonghe (TW); Chih Jen Yang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/115,317

(22) Filed: Apr. 27, 2005

(65) Prior Publication Data

US 2006/0082289 A1    Apr. 20, 2006

(30) Foreign Application Priority Data

Oct. 15, 2004    (TW)    ............................... 93131255 A

(51) Int. Cl.
    *H01J 63/04*    (2006.01)
(52) U.S. Cl. .................. 313/504; 313/506; 313/507; 313/498
(58) Field of Classification Search ................ 313/504, 313/495, 492, 498
    See application file for complete search history.

(56) References Cited

U.S. PATENT DOCUMENTS

| | | | | |
|---|---|---|---|---|
| 3,710,167 A | * | 1/1973 | Dresner et al. | 313/504 |
| 5,712,361 A | * | 1/1998 | Stern et al. | 528/86 |
| 6,004,685 A | * | 12/1999 | Antoniadis et al. | 428/690 |
| 6,046,543 A | * | 4/2000 | Bulovic et al. | 313/504 |
| 6,483,236 B1 | * | 11/2002 | Hung | 313/506 |
| 6,949,880 B1 | * | 9/2005 | Guenther et al. | 313/512 |
| 2002/0027416 A1 | * | 3/2002 | Kim et al. | 313/506 |
| 2003/0190768 A1 | * | 10/2003 | Lu et al. | 438/99 |
| 2004/0245917 A1 | * | 12/2004 | Lu et al. | 313/503 |

\* cited by examiner

*Primary Examiner*—Joseph Williams
*Assistant Examiner*—Hana Asmat Sanei
(74) *Attorney, Agent, or Firm*—Troxell Law Office, PLLC

(57) ABSTRACT

A cathode structure for inverted OLEDs is provided, which comprise a substrate, a conductive electrode layer, an organic material layer, a dielectric layer, and a metal layer. Wherein, the conductive electrode layer is disposed over the substrate, the organic structure layer is disposed over the conductive electrode layer, the dielectric layer is disposed over the organic material layer, and the metal layer is disposed over the dielectric layer. Such cathode structure can function without using the metals of low work function and high chemical activity so as to benefit the manufacturing of organic light emitting devices and displays, and provide a more stable working conditions.

15 Claims, 6 Drawing Sheets

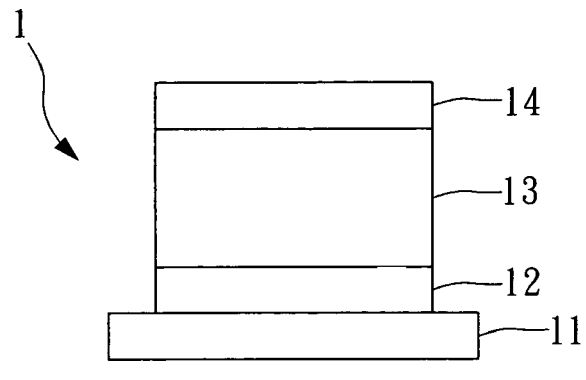
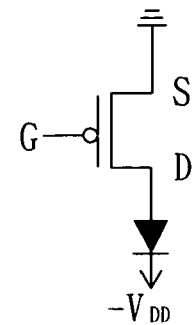
FIG. 1A
(PRIOR ART)
FIG. 1B
(PRIOR ART)
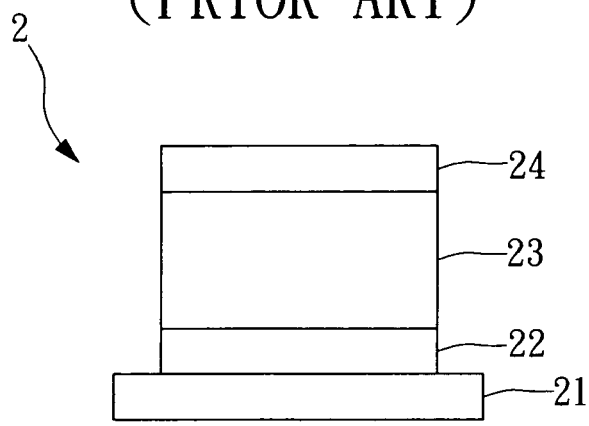
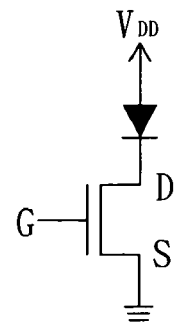
FIG. 2A
FIG. 2B
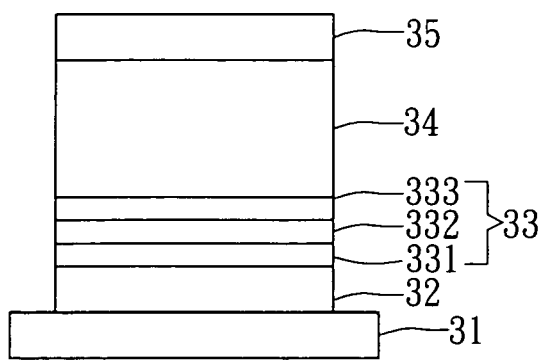
FIG. 3

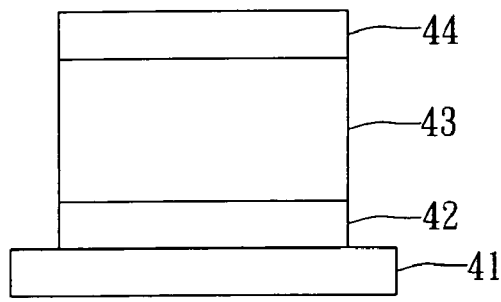
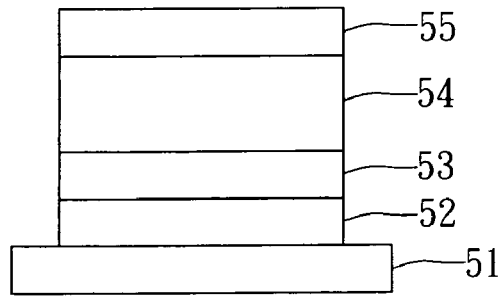
FIG. 4A FIG. 4B
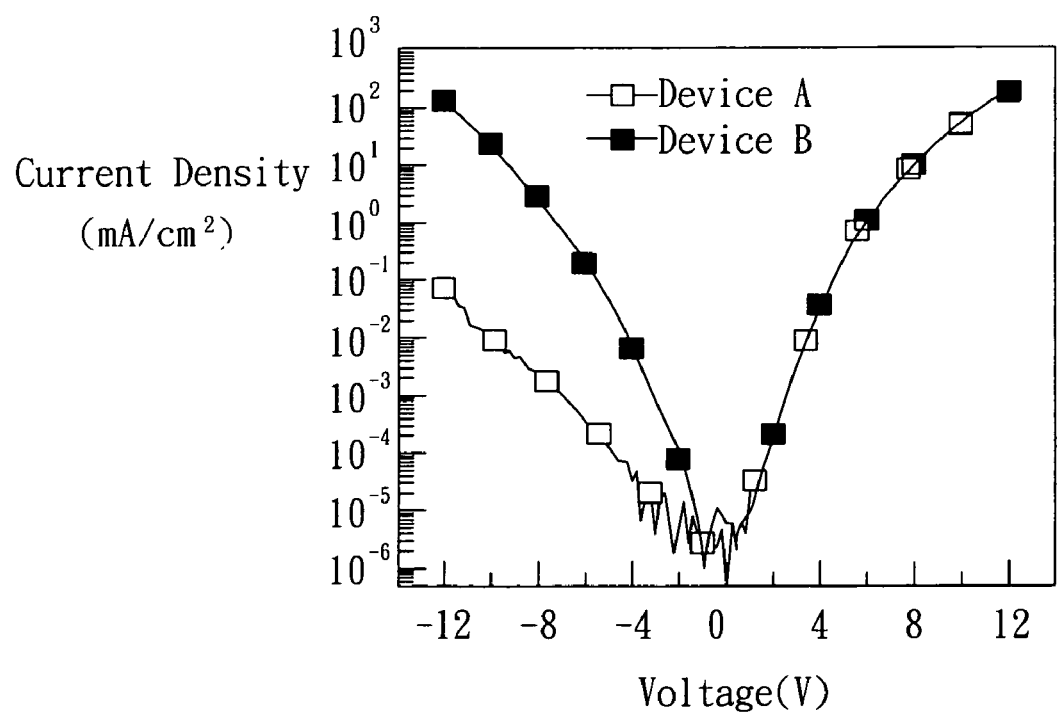
FIG. 4C

CATHODE STRUCTURE FOR INVERTED ORGANIC LIGHT EMITTING DEVICES

FIELD OF THE INVENTION

The present invention relates to a cathode structure for inverted Organic Light Emitting Devices (OLED), in particular to a cathode structure for inverted OLEDs including an electron injection layer.

BACKGROUND OF THE INVENTION

For more than decades, researches focused on materials of organic conductive molecules and macromolecules were developing rapidly. By virtue of the maturity of organic conductor, insulator, and semiconductor materials, the application of such organic semiconductor materials in electronic devices and optoelectronic devices, such as organic light-emitting diodes, organic laser, organic memory, solar cells, thin film transistors (TFTs), and so on, have been gradually attracted their potential. Generally, the organic semiconductor-based optoelectronic devices possessing the characteristics of being fabricated as thin film device and by low temperature process can be used in various substrates and large size manufacturing process, that is different from the conventional inorganic semiconductor.

The earliest organic light-emitting device (OLED) was disclosed in 1963 by Pope et al., in which a light-emitting phenomenon was observed while a bias voltage of 1000V is being applied on an anthracene crystal of 1 mm in thickness. However, the operating voltage is too high to be applied in real display devices. Current OLEDs and manufacturing methods of the same were disclosed by C. W. Tang and S. A. VanSlyke of Eastman Kodak Corporation in 1987, that a vacuum evaporation method was used to deposit amorphous organic films sequentially on a glass substrate having a transparent electrode of Indium-Tin-Oxide (ITO), and then the substrate with several layer of organic films deposited thereon is plated with a layer of cathode so as to complete an OLED. Such OLED can largely reduce the operating voltage to below 10V enabling the OLED to be used in real world.

Conventional organic light emitting devices are all forward-stacked structures consisting of bottom anode layer and top cathode layer, as shown in FIG. 1. The organic light emitting device 1 comprises a substrate 11, an anode layer 12, an organic structure layer 13, and a cathode layer 14 stacked sequentially. When the OLED is applied in fabricating an active-matrix organic light emitting display (AMOLED), the organic light emitting device 1 is coupling to the transistors of active-matrix driving circuit arranged on the substrate 11 (not shown in the figure) via the anode layer 12, and it is preferred to employ an equivalent voltage-controlled current source for driving the circuit of the organic light emitting device 1 that the equivalent voltage-controlled current source usually can be a p-channel transistor, as shown in FIG. 1B. However, in a common transistor, such as a-Si field effect transistor (FET) and poly-Si FET, the electric characteristics of p-channel transistor like carrier mobility are obviously inferior to those of n-channel transistor, and thus there is only n-channel transistor available for the a-Si FET. The inverted OLED including the structure consisting of a bottom cathode layer and a top anode layer is an OLED capable of employing n-channel transistors as an equivalent voltage-controlled current source for driving the circuit of the organic light emitting device. As shown in FIG. 2A, the inverted OLED 2 comprises a substrate 21, a cathode layer 22, an organic structure layer 23, and an anode layer 24 stacked sequentially, wherein n-channel transistors, as shown in FIG. 2B, are used as equivalent voltage-controlled current source for driving the circuit of the organic light emitting device, so that not only the design variability of the active-matrix driving circuit can be increased, but also the efficiency of the AMOLED is raised.

The key factors considered while manufacturing an inverted OLED are the charge transported characteristic and the charge injection capability on the interfaces between device electrode and organic material, and between organic material and another organic material. Since most common organic optoelectronic materials have small electron affinities (EA) (i.e. about or less than 3 ev), some metals of lower work function such as Mg, Ca, Li, and Cs are often chosen to be the cathodes of organic light emitting devices. However, such metals usually have high chemical activity and are easy to deteriorate, that increases the difficulty of process control while the OLED is mass-produced. Besides, the different deposition sequence of metal and organic material will also affect the capability of electron injection on the interface of metal/organic.

V. Bulovic et al. has disclosed a method of using an alloy of Mg and Ag as the bottom cathode of an inverted OLED in 1997. However, the electron injection capability is not good enough, that cause the operating voltage of the OLED is still too high. In addition, to use metal Mg for the bottom cathode will result in the problem of easy deterioration due to its high chemical activity so that such method will affect the device characteristics, causing some integration problems in the following processes for manufacturing organic light emitting displays.

In 2002, X. Zhou et al. and S. R. Forrest et al. published an inverted OLED of p-i-n structure, of which the organic material is doped with metals of high activity and low work function, such as Li and Cs, acting as the n-type dopants for promoting the electrons to be injected from the bottom cathode of the inverted OLED into the organic layer. Such method makes it possible to use the conductive materials of low chemical activity but high stability as the bottom cathode of an inverted OLED. However, the electron injection layer of the cathode of the foregoing OLED is formed by doping an organic material layer with metals of high activity and low work function as n-type dopants, that the above mentioned method still suffer the same difficulty of handling metals of high activity and low work function. In addition, atoms of such metals, i.e. Li and Cs, are easily diffused in the organic material, which will affect the operating of device.

In summary, from the past scientific or technical literatures referring inverted OLEDs, the structures and processes of bottom cathode all include the usage of metals with high chemical activity and low work function, which are easily deteriorated and thus affect the characteristics of the OLED. Moreover, it is still difficult to handle the metals with high chemical activity in the process for manufacturing organic light emitting display.

SUMMARY OF THE INVENTION

It is the primary object of the present invention to provide a cathode structure for an inverted OLED, which includes an electron injection layer containing no metals of high activity and low work function and a cathode layer. The electron injection layer can increase the electron injection capability of the inverted OLED so as to improve the optoelectronic characteristics of the inverted OLED.

It is another object of the present invention to provide a cathode structure for an inverted OLED, which possesses the excellent electron injection capability without using metals of high activity and low work function so as to prevent the problem of deterioration and be more compatible to the current OLED manufacturing process, and thus enable the inverted OLED to be applied in an active-matrix organic light emitting display (AMOLED).

In order to achieve the aforesaid objects, the present invention provides a cathode structure for an inverted OLED, comprising: a conductive electrode layer; an organic material layer arranged on top of the conductive electrode layer; a dielectric layer arranged on top of the organic material layer; and a metal layer arranged on top of the dielectric layer; wherein the conductive electrode layer is used as the cathode of the OLED; and the organic material layer, the dielectric layer and the metal layer are used as an electron injection layer of the OLED.

Further, in order to achieve the aforesaid objects, the present invention provides an inverted OLED, comprising a substrate, a conductive electrode layer, an organic material layer, a dielectric layer, a metal layer, an organic structure layer, and an anode layer. Wherein, the conductive electrode layer is disposed over the substrate, the organic structure layer is disposed over the conductive electrode layer, the dielectric layer is disposed over the organic material layer, the metal layer is disposed over the dielectric layer, the organic structure layer is disposed over the electron injection layer, and the anode layer is disposed over the organic structure.

The organic layer of the inverted OLED according to the present invention can be a single organic layer possessing the functions of positive/negative charge transporting and light-emitting. It also can be a multi-layer structure, for example, 1) it can be a multi-layer structure consisted of an electron transporting/light-emitting layer and an electron hole transporting g layer sequentially deposited on the cathode structure; 2) it can be a multi-layer structure consisted of an electron transporting layer and an electron hole transporting/light-emitting layer sequentially deposited on the cathode structure; 3) it can be a multi-layer structure consisted of an electron transporting layer, a light-emitting layer, and an electron hole transporting layer sequentially deposited on the cathode structure. The aforesaid stacked structures of organic layers are in an illustrative but not restrictive sense. It is intended that the present invention may not be limited to the particular forms as illustrated.

Other objects, advantages and novel features of the present invention will become apparent upon study of the remaining portions of the specification and drawings.

BRIEF DESCRIPTION OF THE DRAWINGS

FIG. 1A is the schematic view showing a conventional OLED.

FIG. 1B is the schematic view showing the circuit of p-channel transistor.

FIG. 2A is the schematic view showing an inverted OLED.

FIG. 2B is the schematic view showing the circuit of n-channel transistor.

FIG. 3 is the schematic view showing an inverted OLED according to the present invention.

FIG. 4A is the schematic view showing a bicathode electron/single carrier device according to the first embodiment of the present invention.

FIG. 4B is the schematic view showing another bicathode electron/single carrier device according to the first embodiment of the present invention.

FIG. 4C is the schematic view showing the relationship of voltage versus current density according to the first embodiment of the present invention.

DETAILED DESCRIPTION OF THE INVENTION

Figure 5A:
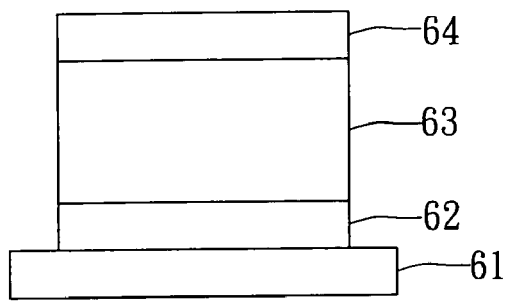
FIG. 5A is the schematic view showing a bicathode electron/single carrier device according to the second embodiment of the present invention.

For your esteemed members of reviewing committee to further understand and recognize the fulfilled functions and structural characteristics of the invention, several preferable embodiments cooperating with detailed description are presented as the follows.

FIG. 3 is the schematic view showing an inverted OLED according to the present invention. The inverted OLED 3 comprises a substrate 31, a cathode layer 32, an electron injection layer 33, an organic structure layer 34, and an anode layer 35. Wherein, the cathode layer 32 is disposed over the substrate 31, the electron injection layer 33 is disposed over the cathode layer 32, the organic structure layer 34 is disposed over the electron injection layer 33, and the anode layer 35 is disposed over the organic structure layer 34. The electron injection layer 33 further comprises an organic material layer 331 disposed over the cathode layer 32, a dielectric layer 332 disposed over the organic material layer 331, and a metal layer 333 disposed over the dielectric layer 332.

The organic material layer 331 can be made of Alq3. The dielectric layer 332 can be made of a material selected from the group consisting of halogen compounds with alkaline metals, halogen compounds with alkaline-earth metals, alkaline metal oxide, alkaline-earth metal oxide, other alkaline metal and alkaline-earth metal compounds, such as LiF, LiO2, NaF, NaCl, CsF, CaF2, MgF2 etc., or can be a stacked structure consisting of layers of foregoing materials or made of a mixture of foregoing materials. The metal layer 333 can be made of aluminum or the alloy of aluminum. The substrate 31 can be either a transparent substrate, made of a transparent material such as glass, quartz, and plastic, or an opaque substrate, made from silicon wafer and GaAs wafer, etc. The cathode layer 32 can be either transparent electrodes, made of materials such as ITO and IZO, etc. or opaque electrodes, made of materials such as Au, Ag, Cu, Al, Cr, Mo, Ti, Ni, Pt, Ir, W, and TA, or the stacked or the mixture of the above materials. The anode layer 35 can comprise an electron hole injection layer and a conductive anode (not shown in the figure), wherein the electron hole injection layer can be the layer doped with conductive dopants, such as m-MTDATA:F4-TCNQ and α-NPD:F4-TCNQ, etc. The conductive anode can be either a transparent electrode such as ITO, IZO, AZO, Indium Oxide, Tin Oxide, Zinc Oxide, or the stacked structure or the mixture of these materials, or an opaque electrode such as Au, Ag, Cu, Al, Cr, Mo, Ti, Ni, Pt, Ir, W, and TA, or the stacked structure or the mixture of these materials.

The following Embodiments 1 through 5 are the preferred embodiments of the cathode structure for an inverted OLED according to the present invention, where the efficiency of the present invention is illustrated by comparing the cathode structures of conventional inverted OLED with those of the present invention.

EMBODIMENT 1

To illustrate that the electron injection layer of the present invention is capable of improving the electron injection capability of the inverted OLED having the cathode made of Ag, we use the bicathode electron/single carrier device for the comparison.

Please refer to FIG. 4A, Device A of the present embodiment comprises a substrate 41 made of glass, a bottom cathode layer 42 made of Ag with 80 nm in thickness, an organic electron transporting layer 43 made of $Alq_3$ with 80 nm in thickness, and a top cathode layer 44 made of a stacked structure of LiF/Al with 0.5 nm and 100 nm in thickness respectively.

Please refer to FIG. 4B, Device B comprises a substrate 51 made of glass, a bottom cathode layer 52 made of Ag with 80 nm in thickness, an electron injection layer 53 made of $Alq_3$/LiF/Al with 0.2 nm, 0.2 nm and 0.3 nm in thickness respectively, an organic electron transporting layer 54 made of $Alq_3$ with 80 nm in thickness, and a top cathode layer 55 made of LiF/Al with 0.5 nm and 100 nm in thickness respectively.

The difference between Device A and B is that Device B has an electron injection layer 53 added between the bottom cathode layer 52 and the organic electron transporting layer 54.

FIG. 4C is the schematic view showing the relationship of voltage versus current according to the first embodiment of the present invention. As shown in FIG. 4C, while both Device A and B are subjecting to a forward biases, that is, electrons are injected from the top cathode, both Devices A and B shows excellent and almost identical V-I characteristic curves because the both top cathodes possess cathode structures of good electron injection characteristic. However, while both Device A and B are subjecting to a reverse biases, that is, electrons are injected from the bottom cathode, the injection current of Device A is obviously lower than that of Device B at the same operating voltage. In addition, the reverse bias V-I curve of Device B is mirror to the forward bias V-I curve of Device B using the vertical line at V=0 as the symmetry axis, indicating that the electron injection layer of the inverted OLED cathode structure according to the present invention can largely improve the electron injection capability of bottom cathode and such electron injection capability of the bottom cathode is compatible to that of conventional cathode structure.

EMBODIMENT 2

To illustrate that the electron injection layer of the present invention is capable of improving the electron injection capability of the inverted OLED having the cathode made of Al, we use the bicathode electron/single carrier device for the comparison.

Please refer to FIG. 5A, Device C of the present embodiment comprises a substrate 61 made of glass, a bottom cathode layer 62 made of Al with 80 nm in thickness, an organic electron transporting layer 63 made of $Alq_3$ with 80 nm in thickness, and a top cathode layer 64 made of LiF/Al with 0.5 nm and 100 nm in thickness respectively.

Figure 5B:
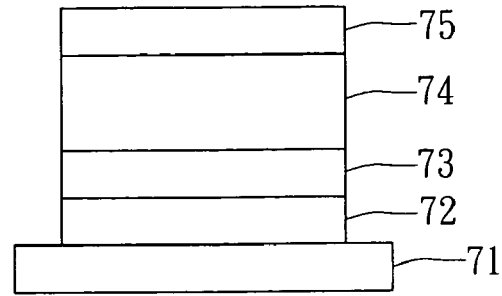
FIG. 5B is the schematic view showing another bicathode electron/single carrier device according to the second embodiment of the present invention.

Please refer to FIG. 5B, Device D comprises a substrate 71 made of glass, a bottom cathode layer 72 made of Al with 80 nm in thickness, an electron injection layer 73 made of $Alq_3$/LiF/Al with 0.2 nm, 0.2 nm and 0.3 nm in thickness respectively, an organic electron transporting layer 74 made of $Alq_3$ with 80 nm in thickness, and a top cathode layer 75 made of LiF/Al with 0.5 nm and 100 nm in thickness respectively.

The difference between Device C and D is that the Device D has an electron injection layer 73 added between the bottom cathode layer 72 and the organic electron transmitting layer 74.

Figure 5C:
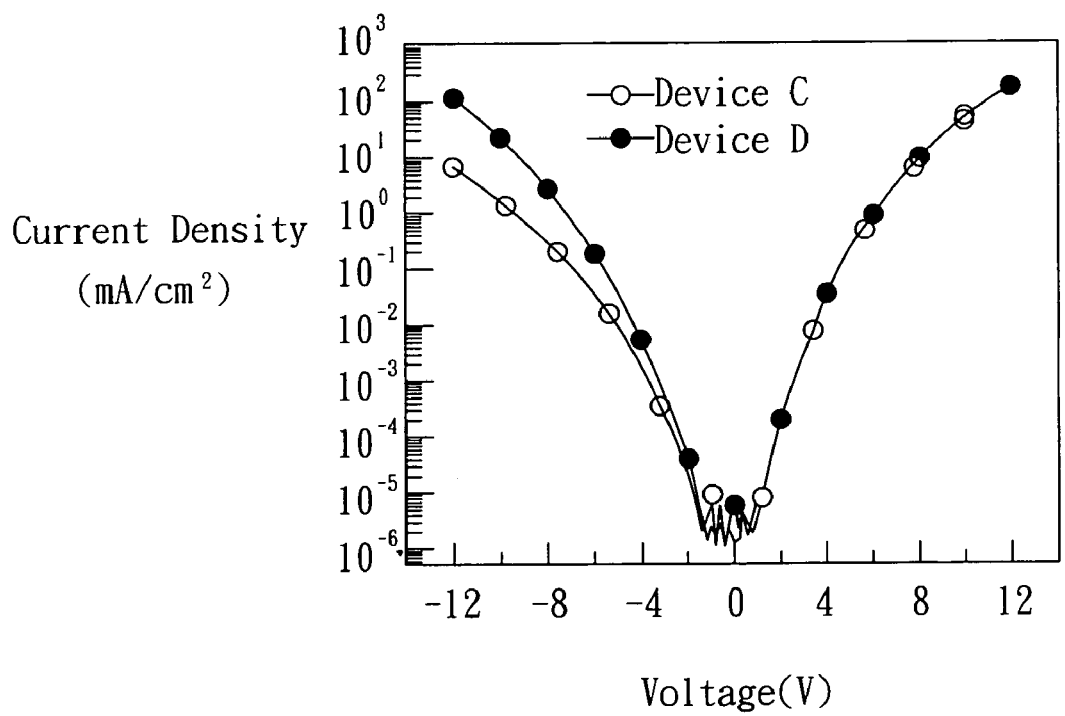
FIG. 5C is the schematic view showing the relationship of voltage versus current density according to the second embodiment of the present invention.

FIG. 5C is the schematic view showing the relationship of voltage versus current according to the second embodiment of the present invention. As shown in FIG. 5C, while both Device C and D are subjecting to a forward biases, that is, electrons are injected from the top cathode, both Devices C and D show excellent and almost identical V-I characteristic curves because the both top cathodes possess cathode structures of good electron injection characteristic. However, while both Device C and D are subjecting to a reverse biases, that is, electrons are injected from the bottom cathode, the injection current of Device C is obviously lower than that of Device D at the same operating voltage. In addition, the reverse bias V-I curve of Device D is mirror to the forward bias V-I curve of Device D using the vertical line at V=0 as the symmetry axis, indicating that the electron injection layer of the inverted OLED cathode structure according to the present invention can largely improve the electron injection capability of bottom cathode and such electron injection capability of the bottom cathode is compatible to that of conventional cathode structure.

EMBODIMENT 3

To illustrate the influence of adding an electron injection layer according to the present invention on the electron injection capability of the inverted OLED having the cathode made of Ag, we use the devices described hereinafter for the comparison.

In this embodiment, the structure of Device E can refer to FIG. 2A, wherein the substrate 21 is a glass substrate, the cathode layer 22 is made of Ag with 80 nm in thickness, the organic structure layer 23 is a stacked structure consisting of a layer of $Alq_3$ with 50 nm in thickness, a layer of α-NPD with 40 nm in thickness, and a layer of a mixture of $F_4$-TCNQ and 2 wt. % m-MTDATA with 20 nm in thickness. Moreover, the anode layer 24 is made of Ag with 20 nm in thickness, on which a refractive index matched layer made of $TeO_2$ with 30 nm in thickness is formed.

The structure of Device F can refer to FIG. 3, wherein the substrate 31 is a glass substrate, the cathode layer 32 is made of Ag with 80 nm in thickness, the electron injection layer 33 is a stacked structure consisting of a layer of $Alq_3$ with 0.2 nm in thickness, a layer of LiF with 0.2 nm in thickness, and a layer of Al with 0.3 nm in thickness, the organic structure layer 34 is a stacked structure consisting of a layer of $Alq_3$ with 50 nm in thickness, a layer of α-NPD with 40 nm in thickness, and a layer of a mixture of $F_4$-TCNQ and 2 wt. % m-MTDATA with 20 nm in thickness. In addition, the anode layer 35 is made of Ag with 20 nm in thickness, on which a refractive index matched layer made of $TeO_2$ with 30 nm in thickness is formed.

The difference between Device E and F is that the Device F has an electron injection layer 33 added between the cathode layer 32 and the organic structure layer 34. In the present embodiment, the layer of $Alq_3$ with 50 nm in thickness is used as the electron transporting/light-emitting layer, the layer of α-NPD with 40 nm in thickness is used as the electron hole transporting layer, and the layer of the mixture of $F_4$-TCNQ and 2 wt. % m-MTDATA with 20 nm in thickness is used as the electron hole injecting layer.

Figure 6A:
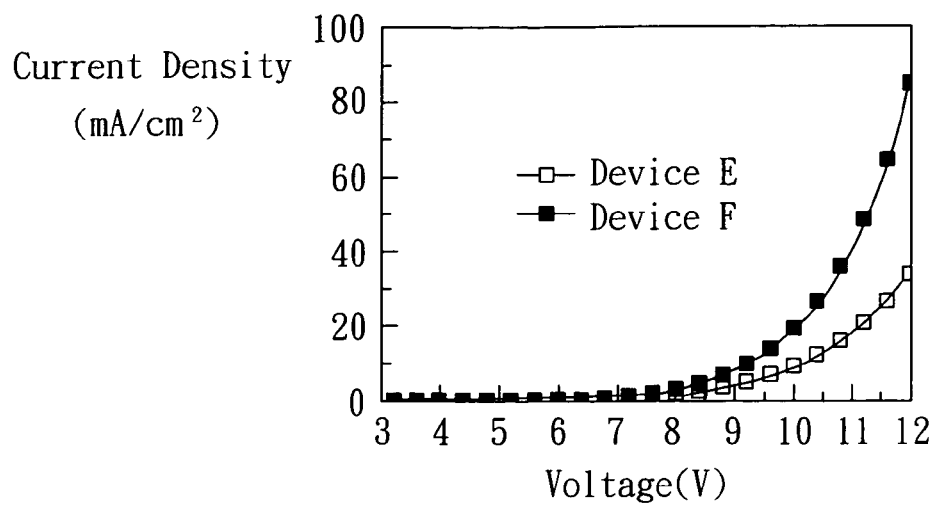
FIG. 6A is the schematic view showing the characteristic curves of current density versus voltage of the devices according to the third embodiment of the present invention.
Figure 6B:
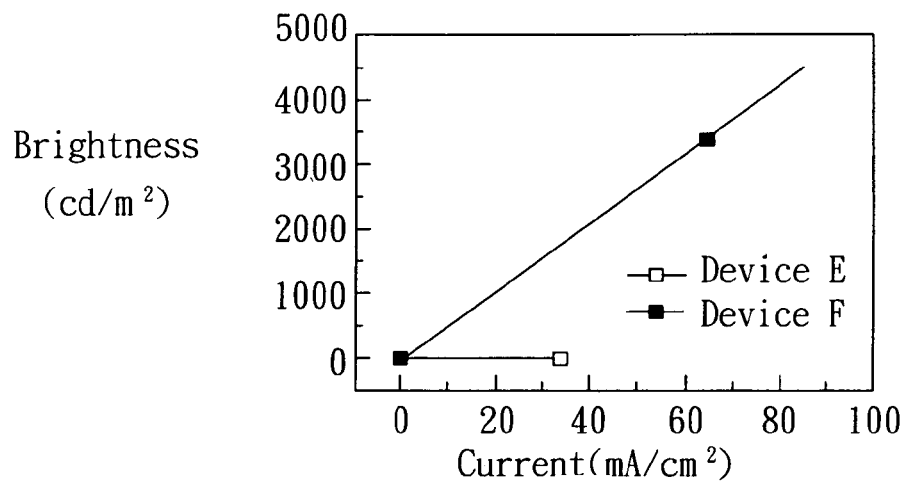
FIG. 6B is the schematic view showing the characteristic curves of brightness versus current density of the devices according to the third embodiment of the present invention.
Figure 6C:
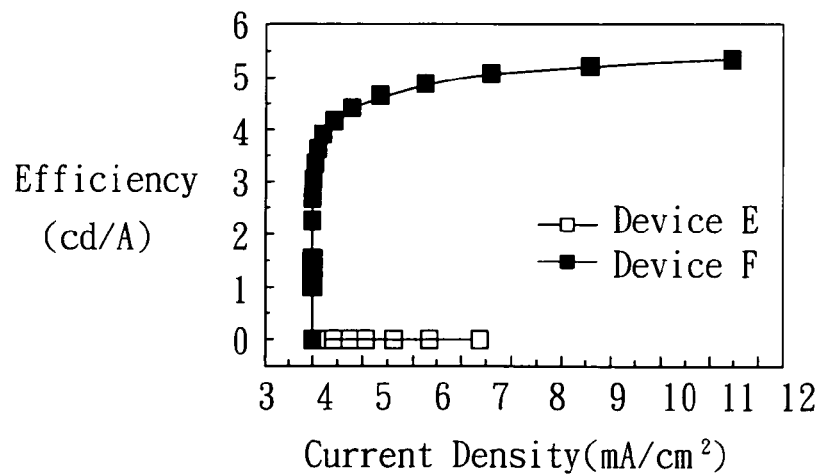
FIG. 6C is the schematic view showing the characteristic curves of radiating efficiency versus current density of the devices according to the third embodiment of the present invention.

FIG. 6A is the schematic view showing the characteristic curves of current density versus voltage of Device E and F. As shown in the figure, Device F including the electron injection layer has more current than Device E in the same operating voltage, indicating that the electron injection layer improves the electron injection characteristic of Device F. FIG. 6B is the schematic view showing the characteristic curves of brightness versus current of the two devices, and FIG. 6C is the schematic view showing the characteristic curves of radiating efficiency versus current density of the two devices. As shown in FIG. 6B, the brightness of Device F is much better than Device E in the same injection current so the radiating efficiency of Device F can attain to 5.3 cd/A much higher than that of Device E, as shown in FIG. 6C, which indicates that the electron injection layer of Device F can efficiently increase the electron injection capability of the device so as to balance the number of electrons and holes in the device thus obtaining the higher radiating efficiency.

EMBODIMENT 4

To illustrate the influence of adding an electron injection layer according to the present invention on the electron injection capability of the inverted OLED having the cathode made of Al, we use the devices described hereinafter for the comparison.

In this embodiment, the structure of Device G can refer to FIG. 2A, wherein the substrate 21 is a glass substrate, the cathode layer 22 is made of Al with 80 nm in thickness, the organic structure layer 23 is a stacked structure consisting of a layer of $Alq_3$ with 50 nm in thickness, a layer of α-NPD with 40 nm in thickness, and a layer of a mixture of $F_4$-TCNQ and 2 wt. % m-MTDATA with 20 nm in thickness. Moreover, the anode layer 24 is made of Ag with 20 nm in thickness, on which a refractive index matched layer made of $TeO_2$ with 30 nm in thickness is formed.

The structure of Device H can refer to FIG. 3, wherein the substrate 31 is a glass substrate, the cathode layer 32 is made of Al with 80 nm in thickness, the electron injection layer 33 is a stacked structure consisting of a layer of $Alq_3$ with 0.2 nm, a layer of LiF with 0.2 nm, and a layer of Al with 0.3 nm in thickness, the organic structure layer 34 is a stacked structure consisting of a layer of $Alq_3$ with 50 nm in thickness, a layer of α-NPD with 40 nm in thickness, and a layer of a mixture of $F_4$-TCNQ and 2 wt. % m-MTDATA with 20 nm in thickness. In addition, the anode layer 35 is made of Ag with 20 nm in thickness, on which a refractive index matched layer made of $TeO_2$ with 30 nm in thickness is formed.

The difference between Device G and H is that Device H has an electron injection layer 33 added between the cathode layer 32 and the organic structure layer 34. In the present embodiment, the layer of $Alq_3$ with 50 nm in thickness is used as the electron transporting/light-emitting layer, the layer of α-NPD with 40 nm in thickness is used as the electron hole transporting layer, and the layer of the mixture of $F_4$-TCNQ and 2 wt. % m-MTDATA with 20 nm in thickness is used as the electron hole injecting layer.

Figure 7A:
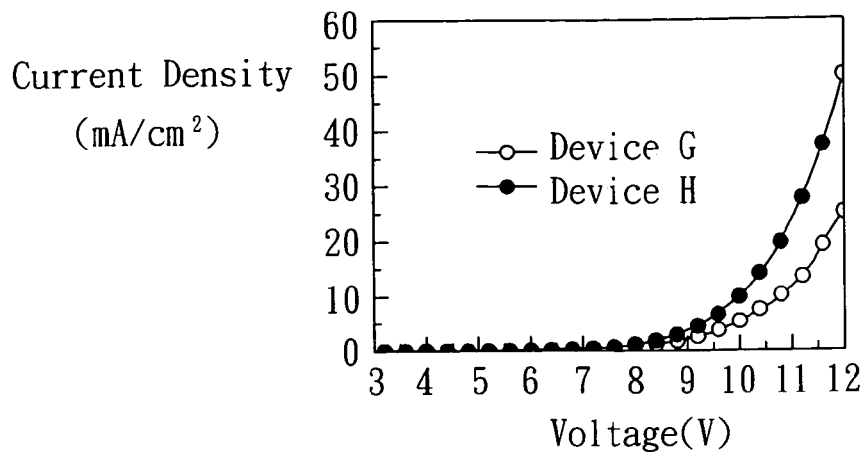
FIG. 7A is the schematic view showing the characteristic curves of current density versus voltage of the devices according to the forth embodiment of the present invention.
Figure 7B:
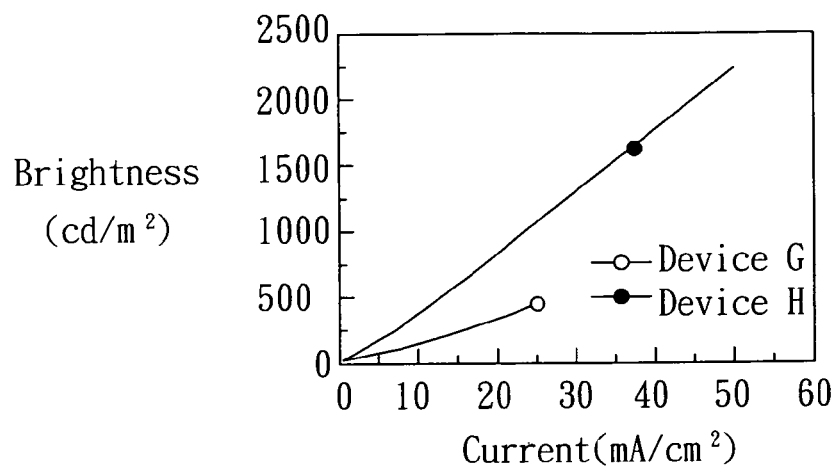
FIG. 7B is the schematic view showing the characteristic curves of brightness versus current density of the devices according to the forth embodiment of the present invention.
Figure 7C:
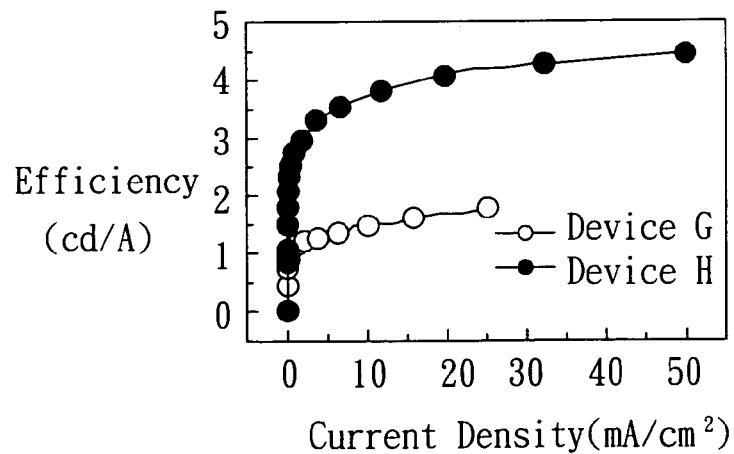
FIG. 7C is the schematic view showing the characteristic curves of radiating efficiency versus current density of the devices according to the forth embodiment of the present invention.

FIG. 7A is the schematic view showing the characteristic curves of current density versus voltage of Device G and H. As shown in the figure, Device H including the electron injection layer has more current than Device G in the same operating voltage, indicating that the electron injection layer improves the electron injection characteristic of Device H. FIG. 7B is the schematic view showing the characteristic curves of brightness versus current of the two devices, and FIG. 7C is the schematic view showing the characteristic curves of radiating efficiency versus current density of the two devices. As shown in FIG. 7B, the brightness of Device H is much better than Device G in the same injection current so the radiating efficiency of Device F can attain to 4.5 cd/A much higher than 1.7 cd/A of Device G, as shown in FIG. 7C, which indicates that the electron injection layer of Device H can efficiently increase the electron injection capability of the device so as to balance the number of electrons and holes in the device thus obtaining the higher radiating efficiency.

EMBODIMENT 5

To illustrate the influence of adding an electron injection layer according to the present invention on the electron injection capability of the inverted OLED having the cathode made of ITO, we use the devices described hereinafter for the comparison.

In this embodiment, the structure of Device I can refer to FIG. 2A, wherein the substrate 21 is a glass substrate, the cathode layer 22 is made of ITO with 120 nm in thickness, the organic structure layer 23 is a stacked structure consisting of a layer of $Alq_3$ with 40 nm in thickness, a layer of α-NPD with 30 nm in thickness, and a layer of a mixture of $F_4$-TCNQ and 2 wt. % m-MTDATA with 20 nm in thickness, in addition, the anode layer 24 is made of Ag with 100 nm in thickness.

The structure of Device J can refer to FIG. 3, wherein the substrate 31 is a glass substrate, the cathode layer 32 is made of ITO with 120 nm in thickness, the electron injection layer 33 is a stacked structure consisting of a layer of $Alq_3$ with 0.2 mm, a layer of LiF with 0.2 nm, and a layer of Al with 0.3 nm in thickness, the organic structure layer 34 is a stacked structure consisting of a layer of Alq$_3$ with 40 nm in thickness, a layer of α-NPD with 30 nm in thickness, and a layer of a mixture of F$_4$-TCNQ and 2 wt. % m-MTDATA with 20 nm in thickness, in addition, the anode layer 35 is made of Ag with 100 nm in thickness.

The difference between Device I and J is that the Device J has an electron injection layer 33 added between the cathode layer 32 and the organic structure layer 34. In the present embodiment, the layer of Alq$_3$ with 40 nm in thickness is used as the electron transporting/light-emitting layer, the layer of α-NPD with 30 nm in thickness is used as the electron hole transporting layer, and the layer of the mixture of F$_4$-TCNQ and 2 wt. % m-MTDATA with 20 nm in thickness is used as the electron hole injecting layer.

Figure 8A:
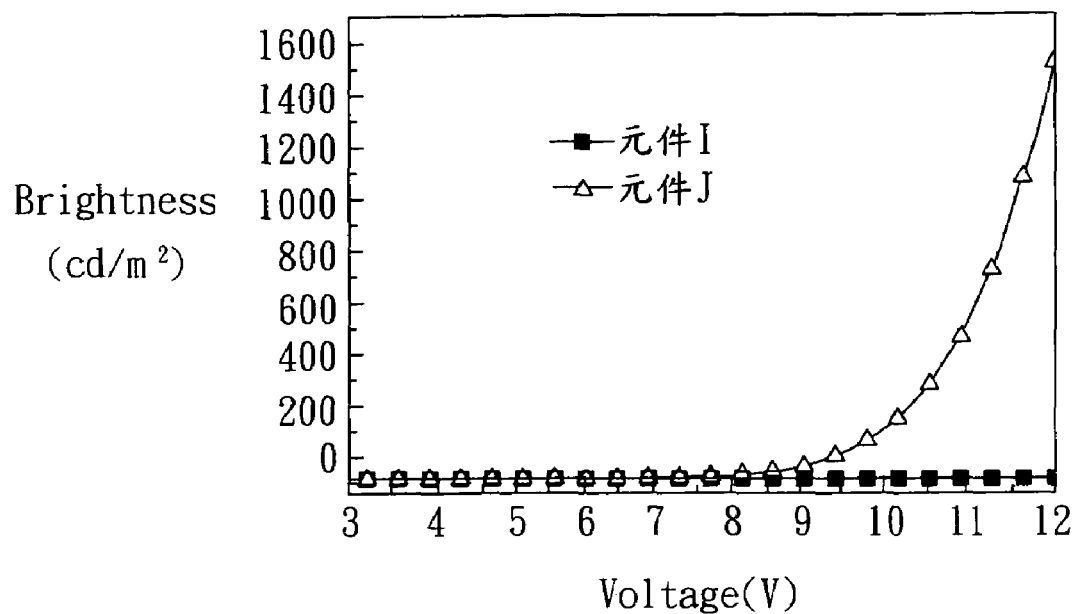
FIG. 8A is the schematic view showing the characteristic curves of brightness versus voltage of the devices according to the fifth embodiment of the present invention.
Figure 8B:
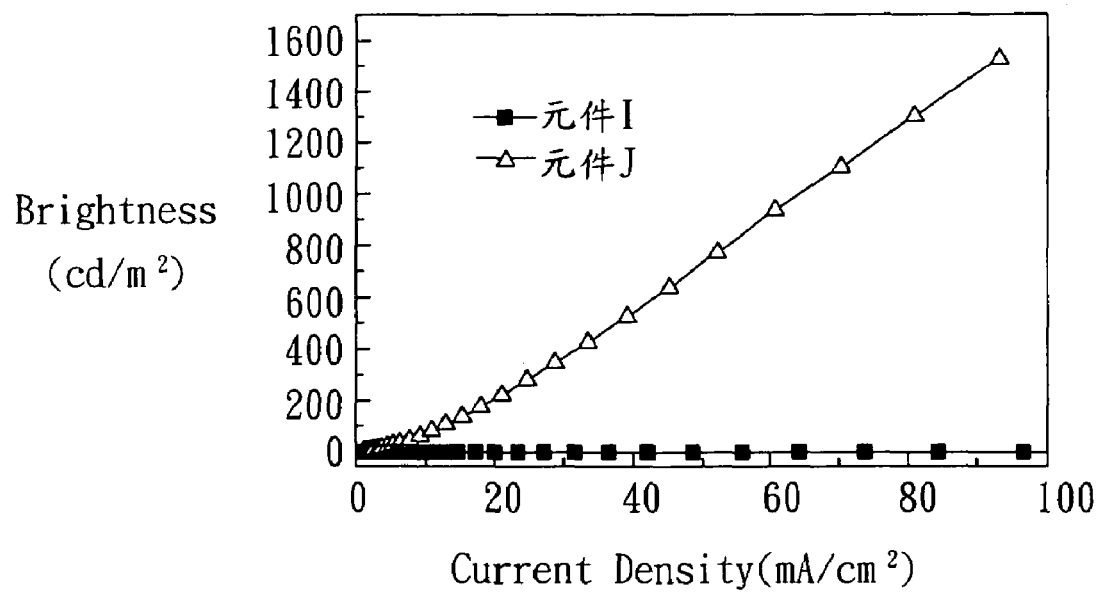
FIG. 8B is the schematic view showing the characteristic curves of brightness versus current density of the devices according to the fifth embodiment of the present invention.

FIG. 8A is the schematic view showing the characteristic curves of brightness versus voltage of the Device I and J, and FIG. 8B is the schematic view showing the characteristic curves of brightness versus current density of the two devices. As shown in FIG. 8A, the brightness of Device J is much better than Device I in the same voltage so the radiating efficiency of Device J can attain to 1.7 cd/A much higher than about 0 cd/A of Device I, as shown in FIG. 8B, which indicates that the electron injection layer of Device J can efficiently increase the electron injection capability of the device so as to balance the number of electrons and holes in the device thus obtaining the higher radiating efficiency.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. An inverted organic light emitting device (OLED), comprising:
    a substrate;
    a conductive electrode layer, disposed over said substrate;
    an electron injection layer, disposed over said conductive electrode layer, further comprising:
        an organic material layer, disposed over said conductive electrode layer;
        a dielectric layer, disposed over said organic material layer; and
        a metal layer, disposed over said dielectric layer;
    an organic structure layer, disposed over said electron injection layer; and
    an anode layer, disposed over said organic structure.

2. The inverted OLED as recited in claim 1, wherein said substrate is a transparent substrate.

3. The inverted OLED as recited in claim 2, wherein said transparent substrate is made of a material selected from the group consisting of glass, quartz, and plastic.

4. The inverted OLED as recited in claim 1, wherein said substrate is an opaque substrate.

5. The inverted OLED as recited in claim 4, wherein said opaque substrate is made of a material selected from the group consisting of silicon wafer and GaAs wafer.

6. The inverted OLED as recited in claim 1, wherein said conductive electrode layer is a transparent electrode layer.

7. The inverted OLED as recited in claim 6, wherein said transparent electrode layer is made of at least a material selected from the group consisting of ITO and IZO.

8. The inverted OLED as recited in claim 1, wherein said conductive electrode layer is a metal layer.

9. The inverted OLED as recited in claim 8, wherein said metal layer is made of at least a material selected from the group consisting of Au, Ag, Cu, Al, Cr, Mo, Ti, Ni, Pt, Ir, W, Ta, and an alloy thereof.

10. The inverted OLED as recited in claim 1, wherein said organic material layer is made of Alq$_3$.

11. The inverted OLED as recited in claim 1, wherein the thickness of said organic material layer is 0.1 nm-5 nm.

12. The inverted OLED as recited in claim 1, wherein said dielectric layer is made of at least a material selected from the group consisting of halogen compounds with alkaline metals, halogen compounds with alkaline-earth metals, alkaline metal oxide, alkaline-earth metal oxide, and other alkaline metal and alkaline-earth metal compounds.

13. The inverted OLED as recited in claim 1, wherein the thickness of said dielectric layer is 0.1 nm-5 nm.

14. The inverted OLED as recited in claim 1, wherein said metal layer is made of at least a material selected from the group consisting of Al and Al alloy.

15. The inverted OLED as recited in claim 1, wherein the thickness of said metal layer is 0.1 nm-5 nm.

* * * * *